United States Patent [19]
Takahashi

[11] Patent Number: 4,656,649
[45] Date of Patent: Apr. 7, 1987

[54] CLOCK FREQUENCY DIVIDER CIRCUIT

[75] Inventor: Hideo Takahashi, Tokyo, Japan

[73] Assignee: NEC Corporation, Japan

[21] Appl. No.: 810,123

[22] Filed: Dec. 18, 1985

[30] Foreign Application Priority Data

Dec. 18, 1984 [JP] Japan .................. 59-266747

[51] Int. Cl.[4] ............... H03K 21/02; H03K 21/10; H03K 5/156
[52] U.S. Cl. .................. 377/48; 377/111; 377/114; 307/269; 307/271; 328/61; 375/118; 375/121
[58] Field of Search ............... 377/47, 48, 111, 114; 307/271, 269; 328/61; 375/118, 121

[56] References Cited

U.S. PATENT DOCUMENTS

| | | | |
|---|---|---|---|
| 3,976,946 | 8/1976 | Schroder | 377/48 |
| 4,231,104 | 10/1980 | St. Clair | 377/48 |
| 4,348,640 | 9/1982 | Clendening | 377/48 |
| 4,406,014 | 9/1983 | Doron | 377/111 |
| 4,408,333 | 10/1983 | Fujii | 375/118 |

*Primary Examiner*—John S. Heyman
*Attorney, Agent, or Firm*—Sughrue, Mion, Zinn, Macpeak and Seas

[57] ABSTRACT

A clock frequency divider circuit for producing signals of a desired frequency (of, for example, 1.024 MHz) in response selectively to input clock pulses of two or more different predetermined frequencies, wherein control pulses are produced from and in synchronism with the input clock pulses and are fed to a frequency division network including two master-slave "D" flip-flop circuits adapted to produce a first predetermined fraction of the frequency of the control pulses in response to input clock pulses of a first frequency (of, for example, 2.048 MHz conforming to CCITT Recommendation standard) or a second predetermined fraction of the frequency of the control pulses in response to input clock pulses of a second or third frequency (of, for example, 1.536 MHz or 1.544 MHz conforming to T-1 standards). Signals with a frequency corresponding to such a first or second predetermined fraction are fed to a frequency selector network in which the frequency fraction is multiplied by a first or second predetermined multiple to achieve the desired frequency.

5 Claims, 6 Drawing Figures

CLOCK FREQUENCY DIVIDER CIRCUIT

FIELD OF THE INVENTION

The present invention relates to PCM (pulse-code mudulated) data transmission systems and particularly to a clock frequency divider circuit for use in a such a data transmission system.

BACKGROUND OF THE INVENTION

Codec (coder-decoder) networks of a PCM data communications system use built-in filters which include an anti-alias filter designed to eliminate the loop distortion in a circuit stage posterior to the analog input of the coder network and a bandpass filter. Each of such anti-alias and bandpass filters is provided typically in the form of a switched capacitor filter and is thus required to be driven at a clock frequency of 1.024 MHz. This clock frequency is produced with use of a frequency divider which is designed to receive input clock pulses of a selected one of different standardized clock frequencies and to multiply each of the input clock frequency by a factor predetermined for the particular input clock frequency. When the T-1 PCM transmission clock frequency of 1.536 MHz or 1.544 MHz is to be used as the input clock frequency, the frequency divider multiplies the input frequency of 1.536 MHz or 1.544 MHz by the factor of ⅔ to produce the desired clock frequency of 1.024 MHz. When, on the other hand, the frequency divider receives an input clock frequency of 2.048 MHz in accordance with the CCITT Recommendation standard for the PCM transmission, then the frequency divider multiplies the input clock frequency by the factor of ½ for producing the clock frequency of 1.024 MHz for the switched capacitor filter.

Various types of clock frequency divider circuits have thus far been proposed and put to use to accomplish such selective division of the standardized clock frequencies. A frequency divider circuit of any of these types is however rather intricate in construction requiring the use of numerous circuit elements which add to the space to be occupied by the divider circuit when the divider circuit is implemented in the form of an LSI semiconductor chip.

It is, accordingly, an object of the present invention to provide an improved clock frequency divider circuit which is simple in construction using a minimized number of circuit elements which will occupy a significantly reduced area on an LSI semiconductor chip.

SUMMARY OF THE INVENTION

In accordance with the present invention, there is provided a clock frequency divider circuit for producing a signal of a desired frequency in response selectively to input clock pulses of a first predetermined frequency or input clock pulses of a second predetermined frequency, comprising (1) means for producing first and second frequency selection signals each having first and second logic states, (2) means for producing a synchronizing signal of a predetermined frequency larger than each of the first and second predetermined frequencies, (3) a clock control network which is responsive to the first frequency selection signal and to the synchronizing signal and which is to be supplied selectively with input clock pulses of the first predetermined frequency or input clock pulses of the second predetermined frequency, the clock control network being operative to produce a first control signal of a frequency which is equal to the frequency of the input clock pulses except in the presence of the first frequency selection signal of the second logic state and in the concurrent precence of said synchronizing signal, or a second control signal of a predetermined logic state in the presence of the first frequency selection signal of the second logic state and the synchronizing signal, (4) a frequency division network which is responsive to the second frequency selection signal and selectively to the first or second control signal and which is operative to produce a first frequency-divided signal of a frequency equal to a first predetermined fraction of the first predetermined frequency in the presence of the second frequency selection signal of the first logic state, or a second frequency-divided signal of a frequency equal to a second predetermined fraction of the second predetermined frequency in the presence of the second frequency selection signal of the second logic state, and (5) a frequency selector network responsive to the second frequency selection signal and selectively to the first or second frequency-divided signal, the frequency selector network being operative to produce output clock pulses of a frequency equal to a first predetermined multiple of the frequency of the first frequency-divided signal in the presence of the second frequency selection signal of the first logic state, or output clock pulses of a frequency equal to a second predetermined multiple ("2") of the frequency of the second frequency-divided signal in the presence of the second frequency selection signal of the second logic state. In a clock frequency divider circuit thus arranged generally the frequency selector network is freferably constructed so that the first predetermined multiple is given as k which is an integer smaller than an integer m representative of the reciprocal of the first predetermined fraction and the second predetermined multiple is given as $(m/n)(f_1/f_2)$ where n is an integer representative of the reciprocal of the predetermined second fraction and $f_1$ and $f_2$ are representative of the first and second predetermined frequencies, respectively.

In a preferred embodiment of a frequency divider circuit according to the present invention, the first control signal has first and second logic states and the frequency division network comprises first and second flip-flop circuits and a logic circuit provided between the first and second flip-flop circuits, each of the first and second flip-flop circuits being responsive selectively to the first or second control signal from the clock control network and comprising a master flip-flop operative to have data latched therein in the presence of the first control signal of the first logic state or in the presence of the second control signal, and a slave flip-flop which is responsive to the data in the master flip-flop in the presence of the first control signal of the second logic state and which is to be isolated from the master flip-flop in the presence of the first control signal of the first logic state or in the presence of the second control signal, the logic circuit being operative to transfer data from the slave flip-flop of the first flip-flop circuit to the master flip-flop of the second flip-flop circuit and from the slave flip-flop of the second flip-flop circuit to the master flip-flop of the first flip-flop circuit.

BRIEF DESCRIPTION OF THE DRAWINGS

The features and advantages of a clock frequency divider circuit according to the present invention will be more clearly appreciated from the following description taken in conjunction with the accompanying drawings in which.

DESCRIPTION OF THE PREFERRED EMBODIMENT

Figure 1:
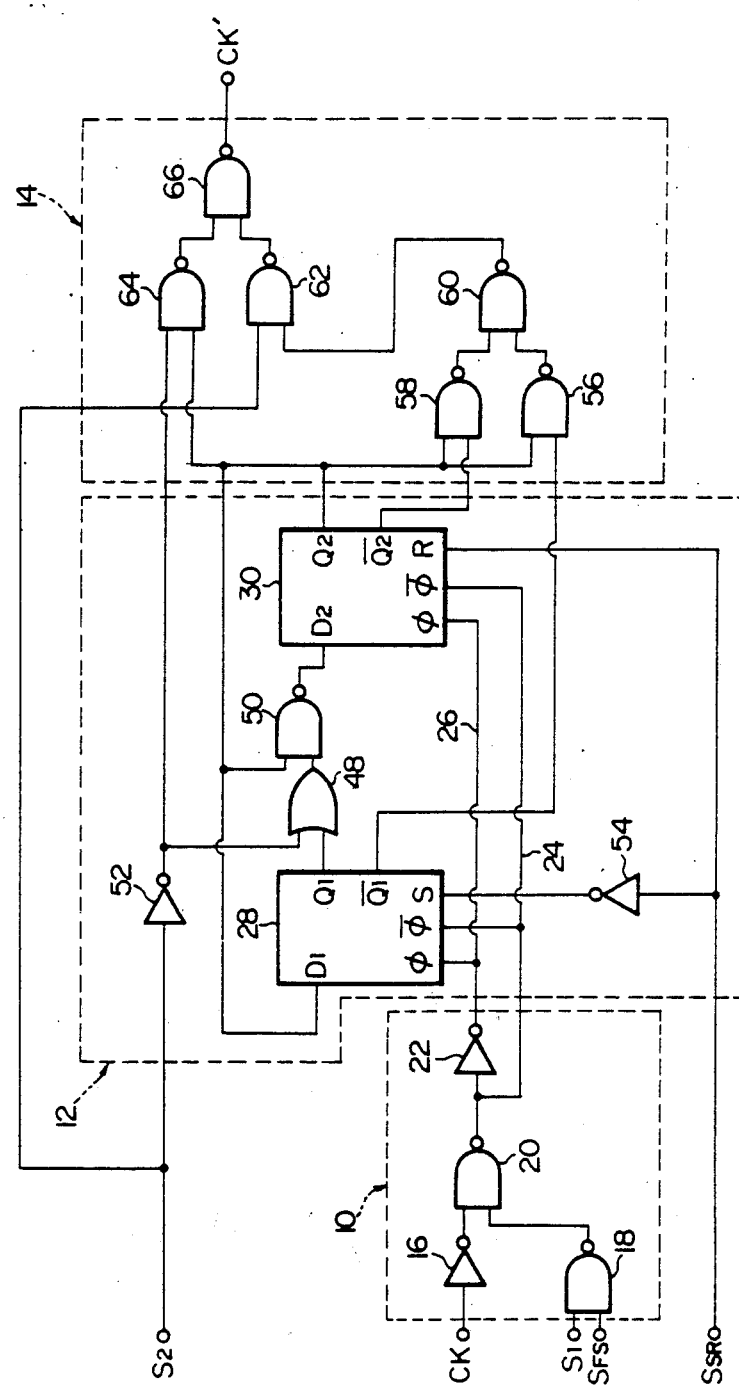
FIG. 1 is a block diagram showing the general construction and arrangement of a clock frequency divider circuit embodying the present invention.

Referring first to FIG. 1, a clock frequency divider circuit embodying the present invention largely consists of a clock control network 10, a frequency division network 12 and a frequency selector network 14. The clock control network 10 in turn has a clock input terminal CK and comprises a first logic inverter 16, a first logic NAND gate 18, a second logic NAND gate 20 and a second logic inverter 22. The first inverter 16 has an input terminal connected to the clock input terminal CK and an output terminal connected to one input terminal of the second NAND gate 20. At the clock input terminal CK of the clock control network 10 is to appear a train of clock pulses having a predetermined clock frequency, there being three different standardized clock frequencies available for such clock pulses. These standardized clock frequencies include 2.048 MHz frequency conforming to the CCITT Recommendation standard and 1.536 MHz and 1.544 MHz frequencies conforming to the T-1 clock frequency standards for PCM carrier transmission.

The first NAND gate 18 of the clock control network 10 has one input terminal connected to a source of a binary signal which serves as a first frequency selection signal $S_1$ in the clock frequency divider circuit. The other input terminal of the first NAND gate 18 is connected to a source of a framing or sampling signal which serves as a synchronizing signal $S_{FS}$ in the frequency divider circuit. The first NAND gate 18 has its output terminal connected to the other input terminal of the second NAND gate 20. The output terminal of the second NAND gate 20 is connected on one hand directly to the frequency division network 12 and on the other hand through the second inverter 22 to the frequency division network 12 as shown. When a logic "0" signal is present as the first frequency selection signal $S_1$ at one input terminal of the first NAND gate 18, there is a logic "1" signal at the output terminal of the first NAND gate 18 without respect to the synchronizing signal $S_{FS}$ at the other input terminal of the NAND gate 18. Under this condition, logic "1" and "0" signals appear at the output terminal of the second NAND gate 20 in the presence and absence, respectively, of logic "1" pulses at the input terminal of the first inverter 16. Thus, pulses $\phi$ complementary to the input clock pulses are supplied from the inverter 22 to the frequency division network 12 and concurrently non-inverted control pulses $\bar{\phi}$ fed directly from the second NAND gate 20 to the frequency division network 12. Thus, the frequency division network 12 has a first control pulse supply line 24 for the non-inverted control pulses $\bar{\phi}$ connected to the output terminal of the second NAND gate 20 and a second control pulse supply line 26 for the inverted control pulses $\phi$ connected to the output terminal of the second inverter 22. The non-inverted control pulses $\bar{\phi}$ and inverted control pulses $\phi$ also appear at these first and second control pulse supply lines 24 and 26, respectively, in the presence of a logic "1" signal as the frequency selection signal $S_1$ at one input terminal of the NAND gate 18 with a logic "0" signal present as the synchronizing signal $S_{FS}$ at the other input terminal of the NAND gate 18. When the signals at both of the input terminals of the first NAND gate 18 are of logic "1" states, then logic "1" and "0" signals appear at the first and second control pulse supply lines 24 and 26, respectively, of the frequency division network 12 without respect to the clock pulses supplied to the clock control network 10. The synchronizing signal $S_{FS}$ provided by the framing or sampling signal for the PCM transmission has a frequency predetermined at 8 KHz in both the T-1 and CCITT Recommendation systems and a pulsewidth equal to the pulse cycle of the clock pulses to be supplied from the clock input terminal CK as will be readily seen from FIGS. 4, 5 and 6.

Figure 2:
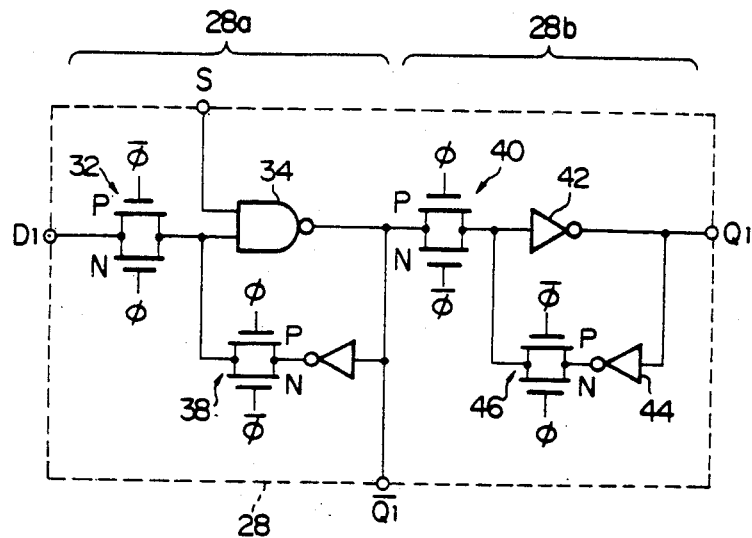
FIG. 2 is a block diagram showing a preferred example of a flip-flop circuit which forms part of the clock frequency divider circuit shown in FIG. 1.

The frequency division network 12 of the clock frequency divider circuit shown in FIG. 1 comprises a series combination of first and second flip-flop circuits 28 and 30 each of which is assumed to be of the CMOS-gated, static D-latch, master-slave design by way of example. The first flip-flop circuit 28 consists of a master flip-flop 28a and a slave flip-flop 28b and has an input terminal $D_1$, inverted and non-inverted output terminals $Q_1$ and $\bar{Q}_1$ and a set terminal S as shown in FIG. 2. Similarly, the second flip-flop circuit 30 consists of a master flip-flop 30a and a slave flip-flop 30b and has an input terminal $D_2$, inverted and non-inverted output terminals $Q_2$ and $\bar{Q}_2$ and a reset terminal R as shown in FIG. 3.

The master flip-flop 28a of the first flip-flop circuit 28 comprises a transmission gate 32, a logic NAND gate 34, a logic inverter 36 and a transmission gate 38, each of the gates 32 and 38 being assumed to be iformed by a CMOS (complementary metal oxide semiconductor). The gate 32 has its p-channel gate connected to the control pulse supply line 24 for the non-inverted control pulses $\phi$ and its n-channel gate connected to the control pulse supply line 26 for the inverted control pulses $\bar{\phi}$. Furthermore, the gate 32 has its drains connected between the input terminal $D_1$ and one input terminal of the NAND gate 34. The other input terminal of the NAND gate 34 is connected to the set terminal S of the flip-flop circuit 28. The NAND gate 34 has its output terminal connected to the inverted output terminal $\bar{Q}_1$ of the flip-flop circuit 28 and further by way of the inverter 36 and the gate 38 to the former input terminal of the NAND gate 34 as shown. The gate 38 has its p-channel gate connected to the second control pulse supply line 26 for the inverted control pulses $\phi$ and its n-channel gate connected to the first control pulse supply line 24 for the non-inverted control pulses $\overline{\phi}$. On the other hand, the slave flip-flop 28b of the first flip-flop circuit 28 comprises a transmission gate 40, logic inverters 42 and 44 and a transmission gate 46, each of the gates 40 and 46 being also assumed to be implemented by a CMOS. The gate 40 has its p-channel gate connected to the second control pulse supply line 26 for the inverted control pulses $\phi$ and its n-channel gate connected to the first control pulse supply line 24 for the non-inverted control pulses $\overline{\phi}$. Furthermore, the gate 40 has its drains connected between the output terminal of the NAND gate 34 of the master flip-flop 28a and, through the inverter 42, the non-inverted output terminal $Q_1$ of the flip-flop circuit 28. The inverter 42 thus intervening between the gate 40 and the non-inverted output terminal $Q_1$ is further connected through the inverter 44 and the gate 46 to the input terminal of the inverter 42 as shown. The gate 46 has its p-channel gate connected to the first control pulse supply line 24 for the non-inverted control pulses $\overline{\phi}$ and its n-channel gate connected to the second control pulse supply line 26 for the inverted control pulses $\phi$.

Figure 3:
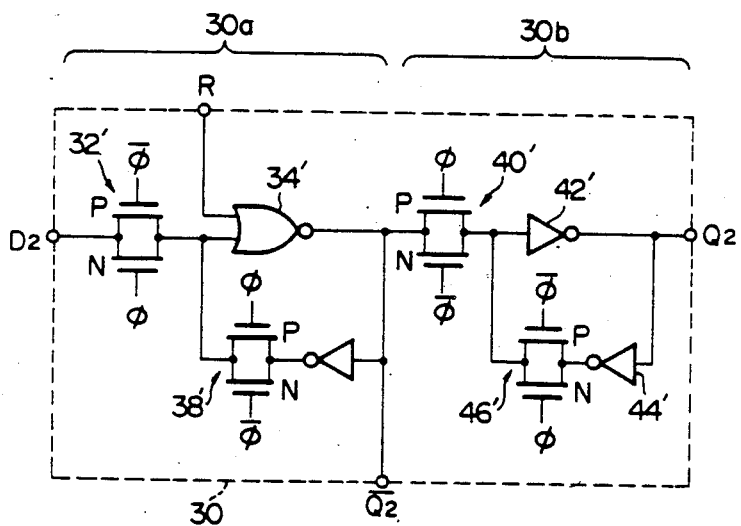
FIG. 3 is a block diagram showing a preferred example of another flip-flop circuit which forms part of the clock frequency divider circuit shown in FIG. 1.

The second flip-flop circuit 30 is essentially similar in construction to the first flip-flop circuit 28 and, as shown in FIG. 3, the master flip-flop 30a thereof comprises a transmission gate 32', a logic NOR gate 34', a logic inverter 36' and a transmission gate 38'. The gate 32' has its drains connected between the input terminal $D_2$ and one input terminal of the NOR gate 34', the other input terminal of which is connected to the reset terminal R of the flip-flop circuit 30. The NOR gate 34' has its output terminal connected to the inverted output terminal $\overline{Q}_2$ of the flip-flop circuit 30 and further through the inverter 36' and the gate 38' to the former input terminal of the NOR gate 34' as shown. On the other hand, the slave flip-flop 30b of the flip-flop circuit 30 comprises a transmission gate 40', logic inverters 42' and 44' and a transmission gate 46'. The gate 40' has its drains connected between the output terminal of the NOR gate 34' of the master flip-flop 30a and, via the inverter 42', the non-inverted output terminal $Q_2$ of the flip-flop circuit 30. The inverter 42' thus intervening between the gate 40' and the non-inverted output terminal $Q_2$ is further connected through the inverter 44' and the gate 46' to the input terminal of the inverter 42'. The non-inverted output terminal $Q_2$ of the flip-flop circuit 30 thus constructed is connected back to the input terminal $D_1$ of the first flip-flop 28 as shown in FIG. 1. As in the first flip-flop circuit 28, furthermore, each of the gates 32' and 46' has its p-channel gate connected to the first control pulse supply line 24 for the non-inverted control pulses $\overline{\phi}$ and its n-channel gate connected to the control second pulse supply line 26 for the inverted control pulses $\phi$. Likewise, each of the gates 38' and 40' has its p-channel gate connected to the control pulse supply line 26 for the inverted control pulses $\phi$ and its n-channel gate connected to the control pulse supply line 24 for the non-inverted control pulses $\overline{\phi}$. Each of the transmission gates 32', 38', 40' and 46' is also assumed to be formed by a CMOS by way of example.

As further shown in FIG. 1, the first and second flip-flop circuits 28 and 30 are connected together through a combination of a logic OR gate 48 and a logic NAND gate 50. The OR gate 48 has one of its input terminals connected to the non-inverted output terminal $Q_1$ of the first flip-flop circuit 28. The other input terminal of the OR gate 48 is connected through a logic inverter 52 to a source of a binary signal which is to serve as a second frequency selection signal $S_2$ in the clock frequency divider circuit according to the present invention. The OR gate 48 has its output terminal connected to one input terminal of the NAND gate 50, the other input terminal of which is connected to the non-inverted output terminal $Q_2$ of the second flip-flop circuit 30, as shown. The two flip-flop circuits 28 and 30 are associated with a source of a set/reset signal $S_{SR}$ which is connected to the set terminal S of the first flip-flop circuit 28 via a logic inverter 54 and directly to the reset terminal R of the second flip-flop circuit 30. The set/reset signal $S_{SR}$ is formulated to appear concurrently with the synchronizing signal $S_{FS}$ and to have a pulsewidth which is half the pulsewidth of the synchronizing signal $S_{FS}$. In the presence of the second frequency selection signal $S_2$ of a logic "0" state, the frequency division network 12 is operative to produce at the non-inverted and inverted output terminals $Q_2$ and $\overline{Q}_2$ of the second flip-flop circuit 30 mutually complementary pulse signals each having a frequency equal to one half of the frequency of the clock pulses supplied from the clock input terminal CK as will be understood more clearly. When, on the other hand, the second frequency selection signal $S_2$ is of a logic "1" state, there are produced at the non-inverted and inverted output terminals $Q_2$ and $\overline{Q}_2$ of the second flip-flop circuit 30 pulses of a frequency equal to one third of the frequency of the supplied clock pulses. Thus, the fraction by which the supplied clock pulse frequency is to be multiplied in the frequency division network 12 depends on the logic status of the second frequency selection signal $S_2$.

On the other hand, the frequency selector network 14 comprises first to sixth logic NAND gates 56 to 66 as shown in FIG. 1. One input terminal of the first NAND gate 56 is connected to the inverted output terminal $\overline{Q}_1$ of the first flip-flop circuit 28 and the other input terminal of the NAND gate 56 is connected to the non-inverted output terminal $Q_2$ of the second flip-flop circuit 30. The second NAND gate 58 has its input terminals connected to the inverted and non-inverted output terminals $Q_2$ and $\overline{Q}_2$, respectively, of the second flip-flop circuit 30. The third NAND gate 60 has its input terminals connected to the output terminals of the first and second NAND gates 56 and 58, respectively. The fourth NAND gate 62 has one of its input terminals connected to the output terminal of this third NAND gate 60. The other input terminal of the NAND gate 62 is connected to the source of the second frequency selection signal $S_2$ in shunt across the inverter 52 as shown. The fifth NAND gate 64 has one of its input terminals connected to the non-inverted output terminal $Q_2$ of the second flip-flop circuit 30, the other input terminal of the NAND gate 64 being connected to the source of the second frequency selection signal $S_2$ through the inverter 52. The sixth NAND gate 66 has its input terminals connected to the output terminals of the fourth and fifth NAND gates 62 and 64, respectively. The frequency selector network 14 thus constructed and arranged has a clock output terminal CK' connected to the output terminal of this sixth NAND gate 66.

In the presence of the second frequency selection signal $S_2$ of a logic "0" state, the above described frequency selector network 14 acts as a mere transparent circuit consisting essentially of the fourth, fifth and sixth NAND gates 62, 64 and 66. In this instance, the pulses produced at the non-inverted output terminal $Q_2$ of the second flip-flop circuit 30 of the frequency division network 12 are simply passed through the fifth and sixth NAND gates 64 and 66 to the clock output terminal CK' of the frequency selection network 14. Accordingly, the frequency of the clock pulses thus appearing at the clock output terminal CK' is equal to one half of the frequency of the original clock pulses supplied from the clock input terminal CK as will be understood more clearly as the description proceeds. When, on the other hand, the second frequency selection signal $S_2$ is of a logic "1" state, the frequency selector network 14 functions as a multiplier circuit consisting essentially of the first, second, third, fourth and sixth NAND gates 56, 58, 60, 62 and 66. In this instance, the frequency selector network 14 produces at the clock output terminal CK' pulses of a frequency doubling the common frequency of the pulses which appear at the inverted output terminal $\overline{Q}_1$ of the first flip-flop circuit 28 and the inverted and non-inverted output terminals $Q_2$ and $\overline{Q}_2$ of the second flip-flop circuit 30 of the frequency division network 12. The frequency of the clock pulses thus appearing at the clock output terminal CK' is equal to two thirds of the frequency of the original clock pulses supplied from the clock input terminal CK, as will also be understood more clearly.

Each of the binary first and second frequency selection signals $S_1$ and $S_2$ is controlled by suitable control means (not shown) to vary between logic "0" and "1" states depending upon whichever of the previously mentioned three different standardized clock frequencies is to be selected. The following table indicates an example of the schedule in accordance with which the frequency selection signals $S_1$ and $S_2$ are thus controlled to vary between the logic "0" and "1" states.

| Frequency Selection Signals | Standardized Clock Frequencies | | |
|---|---|---|---|
| | 2.048 MHz | 1.536 MHz | 1.544 MHz |
| Signal $S_1$ | 0 | 1 | 1 |
| Signal $S_2$ | 0 | 0 | 1 |

Thus, the clock frequency divider circuit embodying the present invention has three different modes of operation corresponding to the three different standardized clock frequencies available. Description will therefore be hereinafter be made in regard to each of these three modes of operation of the clock frequency divider circuit with concurrent reference to FIGS. 1 to 3 and further to FIGS. 4 to 6 of the drawings.

First Mode of Operation (with 2.048 MHz selected)

The clock frequency of 2.048 MHz conforming to the CCITT Recommendation standard is selected with both of the first and second frequency selection signals $S_1$ and $S_2$ set at logic "0" levels. A train of clock pulses including a total of 256 pulses for each frame is supplied from the clock input terminal CK to the inverter 16 of the clock control network 10 (FIG. 1), as indicated in section (b) of FIG. 4. A logic "0" signal being present as the first frequency selection signal $S_1$ at one input terminal of the NAND gate 18 of the clock control network 10, a logic "1" signal appears at the output terminal of the NAND gate 18 without respect to the synchronizing signal $S_{FS}$ at the other input terminal of the NAND gate 18. Logic "1" and "0" signals are thus produced at the output terminal of the NAND gate 20 in the presence and absence, respectively, of a logic "1" pulse at the input terminal of the inverter 16. Thus, non-inverted control pulses $\phi$ are supplied via the first control pulse supply line 24 to the frequency division network 12 and control pulses $\overline{\phi}$ complementary to the input clock pulses are supplied by way of the second control pulse supply line 26 to the frequency division network 12 as indicated in section (d) of FIG. 4.

With a logic "0" signal furnished as the second frequency selection signal $S_2$, a logic "1" signal appears at the output terminal of the inverter 52 so that the OR gate 48 in the frequency division network 12 produces a logic "1" output signal without respect to the signal at the inverted output terminal $\overline{Q}_1$ of the first flip-flop circuit 28. It therefore follows that a logic signal complementary to the signal present at the non-inverted output terminal $Q_2$ of the second flip-flop circuit 30 is passed through the NAND gate 50 to the input terminal $D_2$ of the flip-flop circuit 30. Under these conditions, the master and slave flip-flops 30a and 30b (FIG. 3) of the second flip-flop circuit 30 are operative in combination as a simple binary counter producing at the output terminal $Q_2$ pulses having a frequency equal to one half of the frequency of the supplied control pulses $\overline{\phi}$, as indicated in section (e) of FIG. 4.

On the other hand, the logic "0" frequency selection signal $S_2$ is supplied directly to one input terminal of the fourth NAND gate 62 and the logic "1" signal appearing at the output terminal of the inverter 52 is supplied to one input terminal of the fifth NAND gate 64 in the frequency selector network 14. The fourth NAND gate 62 is thus enabled to produce a logic "1" output signal without respect to the signal present at the other input terminal thereof. The fifth NAND gate 64 is conditioned to produce a logic "1" output signal each time the signal at the non-inverted output terminal $Q_2$ of the second flip-flop circuit 30 falls to a logic "0" level, as will be seen from section (f) of FIG. 4. The sixth NAND gate 66 is thus conditioned to produce a train of pulses complementary to the pulses which appear at the output terminal of the fifth NAND gate 64. The frequency of the pulses thus produced by the NAND gate 66 is equal to one half of the frequency of the original clock pulses of 2.048 MHz so that a train of clock pulses including a total of 128 pulses for each frame and thus having a frequency of 1.024 MHz is delivered from the clock output terminal CK' of the frequency selector network 14 as shown in section (g) of FIG. 4.

Figure 4:
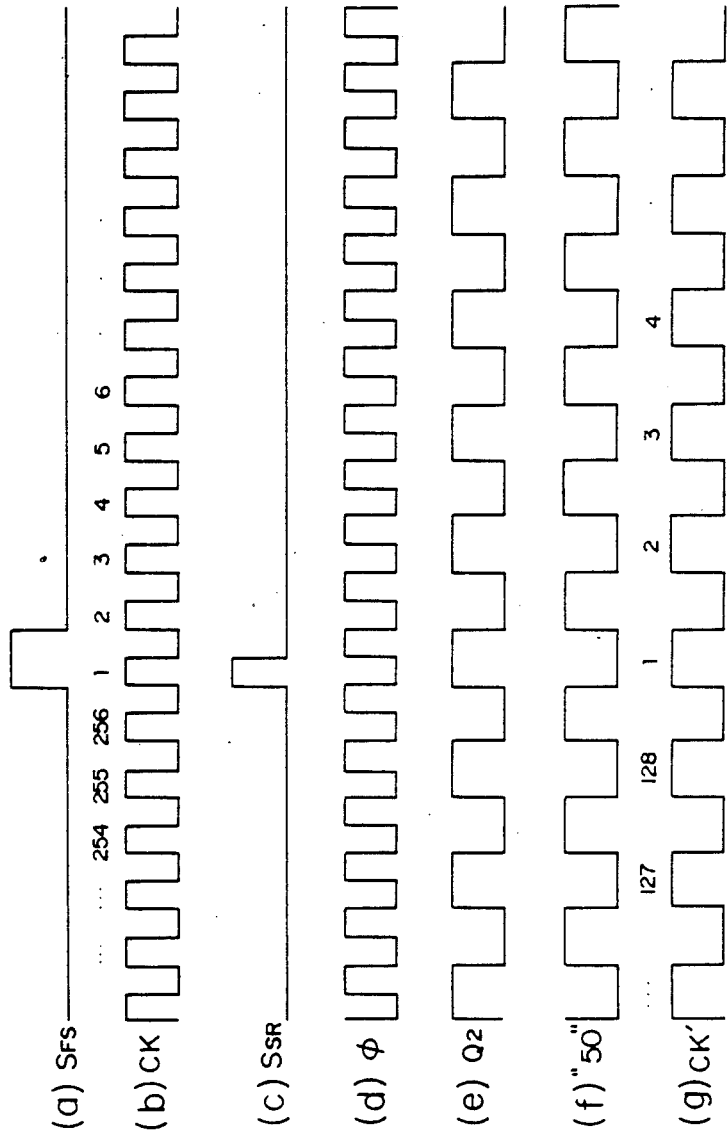
FIG. 4 is a timing chart showing examples of clock signals which are to appear in the clock frequency divider circuit shown in FIGS. 1, 2 and 3 during a first mode of operation of the divider circuit selecting the clock frequency of 2.048 MHz for the input clock pulses.

When the set/reset signal $S_{SR}$ is supplied to the reset terminal R of the second flip-flop circuit 30 of the frequency division network 12 concurrently with the synchronizing signal $S_{FS}$ as indicated in sections (a) and (c) of FIG. 4, the non-inverted output terminal $Q_2$ is fixed at logic "1" level so that the signal at the clock output terminal CK' of the frequency selector network 14 is of a logic "1" state when the synchronizing signal $S_{FS}$ appears at the end of each frame.

Second Mode of Operation (with 1.536 MHz selected)

The clock frequency of 1.536 MHz conforming to the T-1 PCM carrier transmission system is selected with the first frequency selection signal $S_1$ set at a logic "0" level and the second frequency selection signal $S_2$ set at a logic "1" level. A train of clock pulses including a total of 192 pulses for each frame is supplied from the clock input terminal CK to the inverter 16 of the clock control network 10, as indicated in section (b) of FIG. 5. A logic "0" signal being present as the first frequency selection signal $S_1$ at one input terminal of the NAND gate 18 of the clock control network 10, a logic "1" signal appears at the output terminal of the NAND gate 18 without respect to the synchronizing signal $S_{FS}$ at the other input terminal of the NAND gate 18. Accordingly, logic "1" and "0" signals are produced at the output terminal of the NAND gate 20 in the presence and absence, respectively, of logic "1" pulses at the input terminal of the inverter 16. Thus, non-inverted control pulses $\overline{\phi}$ are supplied via the first control pulse supply line 24 to the frequency division network 12 and concurrently control pulses $\phi$ complementary to the input clock pulses supplied by way of the second control pulse supply line 26 to the frequency division network 12 as indicated in section (d) of FIG. 5.

With a logic "1" signal being provided as the second frequency selection signal $S_2$, a logic "0" signal now appears at the output terminal of the inverter 52 so that the status of the output signal from the NAND gate 50 in the frequency division network 12 depends on the status of the signal at the non-inverted output terminal $Q_1$ of the first flip-flop circuit 28 and the status of the signal at the non-inverted output terminal $Q_2$ of the second flip-flop circuit 30. If the signals at both of the non-inverted output terminals $Q_1$ and $Q_2$ of the first and second flip-flop circuits 28 and 30 are of logic "1" states, a logic "1" signal will be present at the output terminal of the OR gate 48 and accordingly a logic "0" signal present at the output terminal of the NAND gate 50 as will be seen from sections (f), (g) and (i) of FIG. 5. If at least one of the signals at the non-inverted output terminals $Q_1$ and $Q_2$ of the flip-flop circuits 28 and 30 is of a logic "0" state, a logic "1" signal will be present at the output terminal of the NAND gate 50 as will be also seen from FIG. 5.

Figure 5:
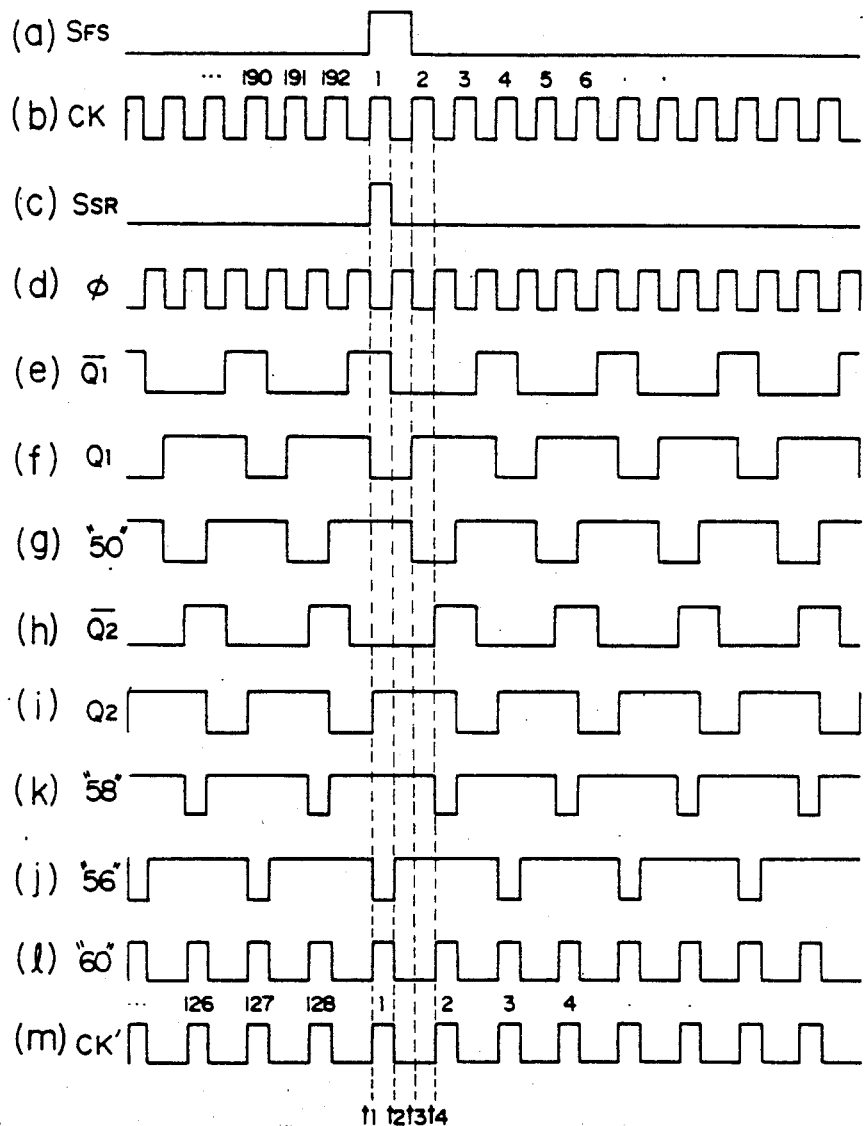
FIG. 5 is a timing chart similar to FIG. 4 but shows examples of clock signals which are to appear during a second mode of operation of the divider circuit selecting the clock frequency of 1.536 MHz for the input clock pulses.

It is now assumed that a logic "1" set/reset signal $S_{SR}$ appears at time $t_1$ concurrently with the synchronizing signal $S_{FS}$ as indicated in sections (a) and (c) of FIG. 5. The first flip-flop circuit 28 now receives a logic "0" signal at its set terminal S through the inverter 54 (FIG. 1) and concurrently the second flip-flop circuit 30 receives the logic "1" set/reset signal $S_{SR}$ at its reset terminal R. At this point of time, the control pulse $\phi$ supplied via the first clock line 26 to the first flip-flop circuit 28 is of a logic "0" state as will be seen from section (d) of FIG. 5. Accordingly, the gates 32 and 46 are closed and the gates 38 and 40 open in the first flip-flop circuit 28, and the gates 32' and 46' are closed and the gates 38' and 40' open in the second flip-flop circuit 30. In the presence of the logic "0" signal at the set terminal S, a logic "1" signal is present at the output terminal of the NAND gate 34 in the master flip-flop 28a of the flip-flop circuit 28 and accordingly at the inverted output terminal $\overline{Q}_1$ of the flip-flop circuit 28 as will be seen from section (e) of FIG. 5. The logic "1" signal produced at the output terminal $\overline{Q}_1$ is passed through the gate 40 and the inverter 42 so that a logic "0" signal appears at the non-inverted output terminal $Q_1$ of the flip-flop circuit 28 as will be seen from section (f) of FIG. 5. It may be noted that the logic "0" signal present at the non-inverted output terminal $Q_1$ of the first flip-flop circuit 28 establishes a logic "1" signal at the output terminal of the NAND gate 50 in the frequency division network 12 shown in FIG. 1, as will be seen from section (g) of FIG. 5.

With the logic "1" set/reset signal $S_{SR}$ being applied to the reset terminal R of the second flip-flop circuit 30, a logic "0" output signal is present at the output terminal of the NOR gate 34' in the master flip-flop 30a and accordingly at the inverted output terminal $\overline{Q}_2$ of the flip-flop circuit 30 as will be seen from section (h) of FIG. 5. The logic "0" signal produced at the output terminal $\overline{Q}_2$ is passed through the gate 40' and the inverter 42' so that a logic "1" signal appears at the non-inverted output terminal $Q_2$ of the flip-flop circuit 30 as will be seen from section (i) of FIG. 5.

When the control pulse $\phi$ thereafter rises to a logic "1" level at time $t_2$ which is later a half clock cycle than time $t_1$, the gates 32 and 46 are open and the gates 38 and 40 closed in the first flip-flop circuit 28 and the gates 32' and 46' are open and the gates 38' and 40' closed in the second flip-flop circuit 30. At time $t_2$, the set/reset signal $S_{SR}$ of the logic "1" state lapses as will be seen from section (c) of FIG. 5 so that a logic "1" signal is present at the set terminal S of the first flip-flop circuit 28 and a logic "0" signal present at the reset terminal R of the second flip-flop circuit 30. Furthermore, there is a logic "1" signal at the input terminal $D_1$ of the first flip-flop circuit 28 with the logic "1" signal present at the non-inverted output terminal $Q_2$ of the flip-flop circuit 30 during the preceding clock cycle. In the presence of the logic "1" signals thus present at both of the input terminals of the NAND gate 34, a logic "0" signal now appears at the output terminal of the NAND gate 34 and accordingly at the inverted output terminal $\overline{Q}_1$ of the first flip-flop circuit 28 as will be seen from section (e) of FIG. 5. The gate 40 being closed as above noted, the slave flip-flop 28b of the first flip-flop circuit 28 is isolated from the master flip-flop 28a so that the logic "1" signal at the inverted output terminal $\overline{Q}_1$ of the flip-flop circuit 28 is latched in the master flip-flop 28a until the gate 40 is to be open during the subsequent clock cycle. The slave flip-flop 28b of the first flip-flop circuit 28 thus maintains the status established therein during the immediately preceding clock cycle so that a logic "0" signal remains present at the non-inverted output terminal $Q_1$ of the flip-flop circuit 28 as will be seen from section (f) of FIG. 5.

With the logic "0" signal $S_{SR}$ present at the non-inverted output terminal $Q_1$ of the flip-flop circuit 28, there is a logic "1" signal at the input terminal $D_2$ of the second flip-flop circuit 30, as will be seen from section (g) of FIG. 5. This logic "1" signal is passed through the gate 32 to one input terminal of the NOR gate 34' so that a logic "0" signal remains present at the output terminal of the NOR gate 34' and accordingly at the inverted output terminal $\overline{Q}_2$ of the second flip-flop circuit 30, as will be seen from section (h) of FIG. 5. With the gate 40' held in the closed state, the slave flip-flop 30b of the flip-flop circuit 30 is isolated from the master flip-flop 30a so that the logic "0" signal at the inverted output terminal $\overline{Q}_2$ of the flip-flop circuit 30 is latched in the master flip-flop 30a until the gate 40' is to be open during the subsequent clock cycle. The slave flip-flop 30b of the second flip-flop circuit 30 thus maintains the status established therein during the immediately preceding clock cycle so that a logic "1" signal remains present at the non-inverted output terminal $Q_2$ of the flip-flop circuit 30 as will be seen from section (i) of FIG. 5.

When the control pulse $\phi$ thereafter turns to a logic "0" level at time $t_3$ which is further later a half clock cycle than time $t_2$, the gates 32 and 46 are closed and the gates 38 and 40 open in the first flip-flop circuit 28 and the gates 32' and 46' are closed and the gates 38' and 40' open in the second flip-flop circuit 30. In the absence of the logic "1" set/reset signal $S_{SR}$, there is a logic "1" signal at the set terminal S of the first flip-flop circuit 28. The NAND gate 34 of the first flip-flop circuit 28 thus remains operative to produce a logic "0" output signal with the gate 38 made open at time $t_3$. This logic "0" output signal is passed through the gate 40 and the inverter 42 so that a logic "1" signal appears at the non-inverted output terminal $Q_1$ of the flip-flop circuit 28 as will be seen from section (f) of FIG. 5. It may be noted in this instance that there presently exists a logic "0" signal at the output terminal of the NAND gate 50 in the frequency division network 12 shown in FIG. 1 and accordingly at the input terminal $D_1$ of the second flip-flop circuit 30 as will be seen from section (g) of FIG. 5 since both of the signals at the non-inverted output terminals $Q_1$ and $Q_2$ of the first and second flip-flop circuits 28 and 30 are now of logic "1" states.

With the logic "0" set/reset signal $S_{SR}$ being applied to the reset terminal R of the second flip-flop circuit 30 and with the gate 38' made open at time $t_3$, a logic "0" signal remains present at the output terminal of the NOR gate 34' in the master flip-flop 30a and accordingly at the inverted output terminal $\overline{Q}_2$ of the flip-flop circuit 30 as will be seen from section (h) of FIG. 5. The logic "0" signal produced at the output terminal $\overline{Q}_2$ is passed through the gate 40' and the inverter 42' so that a logic "1" signal remains present at the non-inverted output terminal $Q_2$ of the flip-flop circuit 30 as will be seen from section (i) of FIG. 5.

When the control pulse $\phi$ rises to a logic "1" level at time $t_4$ which is later a half clock cycle than time $t_3$, the gates 32 and 46 are open and the gates 38 and 40 closed in the first flip-flop circuit 28 and the gates 32' and 46' are open and the gates 38' and 40' closed in the second flip-flop circuit 30. With a logic "1" signal produced at the input terminal of the flip-flop circuit 28 during the preceding clock cycle, the NOR gate 34' receives logic "1" signals at both of its input terminals and remains operative to produce a logic "0" signal at its output terminal and accordingly at the inverted output terminal $\overline{Q}_1$ of the first flip-flop circuit 28 as will be seen from section (e) of FIG. 5. The gate 40' being in the closed state, the logic "1" signal at the inverted output terminal $\overline{Q}_1$ of the flip-flop circuit 28 is latched in the master flip-flop 28a until the gate 40 is to be made open during the subsequent clock cycle. The slave flip-flop 28b of the first flip-flop circuit 28 thus maintains the state established therein during the immediately preceding clock cycle so that a logic "1" signal remains present at the non-inverted output terminal $Q_1$ of the flip-flop circuit 28 as will be seen from section (f) of FIG. 5.

With the logic "0" signals present at both of the non-inverted output terminals $Q_1$ and $Q_2$ of the first and second flip-flop circuits 28 and 30, there is a logic "1" signal at the input terminal $D_2$ of the second flip-flop circuit 30, as will be seen from section (g) of FIG. 5. This logic "1" signal is fed through the gate 32 to one input terminal of the NOR gate 34' so that, with a logic "0" signal present at the other input terminal of the NOR gate 34', a logic "1" signal is present at the output terminal of the NOR gate 34' and at the inverted output terminl $\overline{Q}_2$ of the second flip-flop circuit 30, as will be seen from section (h) of FIG. 5. With the gate 40' is closed, the logic "1" signal at the inverted output terminal $\overline{Q}_2$ of the flip-flop circuit 30 is latched in the master flip-flop 30a so that the slave flip-flop 30b of the second flip-flop circuit 30 maintains the state established therein during the immediately preceding clock cycle. It therefore follows that a logic "1" signal thus remains present at the non-inverted output terminal $Q_2$ of the flip-flop circuit 30 as will be seen from section (i) of FIG. 5.

Thus, pulses of logic "1" states appear at each of the inverted output terminals $\overline{Q}_1$ and $\overline{Q}_2$ and pulses of logic "0" states appear at each of the non-inverted output terminals $Q_1$ and $Q_2$ of the first and second flip-flop circuits 28 and 30, respectively. As will be readily seen from sections (e), (f), (h) and (i) of FIG. 5, the pulses thus appearing at each of these terminals has a frequency (0.512 MHz) equal to one third of the frequency (1.536 MHz) of the control pulses $\phi$ supplied from the clock control network 10 and accordingly of the original clock pulses supplied from the clock input terminal CK of the clock control network 10. Of these pulses having the frequency of 0.512 MHz, the pulses produced at the inverted output terminal $\overline{Q}_1$ of the first flip-flop circuit 28 and the non-inverted and inverted output terminals $Q_2$ and $\overline{Q}_2$ of the second flip-flop circuit 30 are fed to the frequency selector network 14 for being processed therein along with the logic "1" second frequency selection signal $S_2$ and the logic "0" signal complementary to the frequency selection signal $S_2$.

The pulse produced at the inverted output terminal $\overline{Q}_1$ of the first flip-flop circuit 28 is supplied to one input terminal of the first NAND gate 56 and the pulse produced at the inverted output terminal $\overline{Q}_2$ of the second flip-flop circuit 30 fed to one input terminal of the second NAND gate 58. The pulse produced at the non-inverted output terminal $Q_2$ of the second flip-flop circuit 30 is fed to the other input terminal of each of the first and second NAND gates 56 and 58 and one input terminal of the fifth NAND gate 64. On the other hand, the logic "1" second frequency selection signal $S_2$ is supplied to one input terminal of the fourth NAND gate 62, while the logic "0" signal complementary to the frequency selection signal $S_2$ is supplied to the other input terminal of the fifth NAND gate 64.

Thus, the first NAND gate 56 is operative to produce pulses of logic "1" states except when both the pulses from the terminal $\overline{Q}_1$ and the pulses from the terminal $Q_2$ are at logic "1" levels, as will be seen from sections (e), (i) and (j) of FIG. 5. The pulses produced at the output terminal of the first NAND gate 56 are equal in frequency to pulses from the terminals $\overline{Q}_1$ and $Q_2$ and remain at logic "0" levels for a half clock cycle subsequent to each falltime of the pulses from the terminal $\overline{Q}_1$ and each risetime of the pulses from the terminal $Q_2$. The second NAND gate 58 is operative to produce pulses of logic "1" states except when both the pulses from the terminal $\overline{Q}_2$ and the pulses from the terminal $Q_2$ are at logic "1" levels, as will be seen from sections (h), (i) and (k) of FIG. 5. The pulses produced at the output terminal of the second NAND gate 58 are equal in frequency to pulses from the terminals $\overline{Q}_2$ and $Q_2$ and remain at logic "0" levels for a half clock cycle subsequent to each risetime of the pulses from the terminal $\overline{Q}_2$ and each falltime of the pulses from the terminal $Q_2$. In response to the pulses thus produced by the first and second NAND gates 56 and 58, the third NAND gate 60 produces an output pulse at each falltime of the pulses fed to the two input terminals thereof as will be seen from section (1) of FIG. 5. Every two of the pulses thus produced at the output terminal of the third NAND gate 60 corresponds each of the pulses supplied from the first or second NAND gate 56 or 58 and, for this reason, the pulses appearing at the output terminal of the third NAND gate 60 has a frequency of 1.024 MHz equal to two thirds of the original clock pulses having the clock frequency of 1.536 MHz.

The pulses thus produced by the third NAND gate 60 are fed to one input terminal of the fourth NAND gate 62. In the presence of the logic "0" signal at the other input terminal of this NAND gate 62, the pulses from the third NAND gate 60 are inverted by the fourth NAND gate 62. The fifth NAND gate 64 being in a condition producing a logic "1" output signal in the presence of the logic "0" signal complementary to the second frequency selection signal $S_2$, the pulses supplied from the third NAND gate 60 to the fourth NAND gate 62 are further inverted by the sixth NAND gate 66 which thus produces a train of clock pulses which include 128 ($=192 \times \frac{2}{3}$) per frame, as indicated in section (m) of FIG. 5.

Third Mode of Operation (with 1.544 MHz selected)

The clock frequency of 1.536 MHz conforming to the T-1 PCM carrier transmission system is selected with the first frequency selection signal $S_1$ set at a logic "1" level and concurrently the second frequency selection signal $S_2$ set at a logic "1" level. A train of clock pulses including a total of 193 pulses for each frame is supplied from the clock input terminal CK to the input terminal of the inverter 16 of the clock control network 10, as indicated in section (b) of FIG. 6. A logic "1" signal being present as the first frequency selection signal $S_1$ at one input terminal of the NAND gate 18 of the clock control network 10 (FIG. 1), the NAND gate 18 of the clock control network 10 produces an output signal complementary to the synchronizing signal $S_{SF}$ supplied to the other input terminal of the NAND gate 18. Accordingly, pulses identical with the supplied clock pulses are produced at the output terminal of the subsequent NAND gate 20 in response to the synchronizing signal $S_{SF}$ of the logic "0" state and are supplied as the non-inverted control pulses $\phi$ through the first control pulse supply line 24 to the frequency division network 12. Through the second control pulse supply line 26 are thus supplied pulses complementary to these pulses $\bar{\phi}$ as the inverted control pulses $\bar{\phi}$ in response to the synchronizing signal $S_{SF}$ of the logic "0" state as indicated in section (d) of FIG. 6. In the presence of the synchronizing pulse $S_{SF}$ of the logic "1" state, the inverted control pulses $\bar{\phi}$ are maintained at a logic "0" level as shown in section (d) of FIG. 6 and the non-inverted control pulses $\phi$ are maintained at a logic "1" level.

A logic "1" signal being now provided as the second frequency selection signal $S_2$, the status of the output signal from the NAND gate 50 in the frequency division network 12 depends on the status of the signal at the non-inverted output terminal $Q_1$ of the first flip-flop circuit 28 and the status of the signal at the non-inverted output terminal $Q_2$ of the second flip-flop circuit 30. If the signals at both of the non-inverted output terminals $Q_1$ and $Q_2$ of the first and second flip-flop circuits 28 and 30 are of logic "1" states, a logic "1" signal will be present at the output terminal of the OR gate 48 and accordingly a logic "0" signal present at the output terminal of the NAND gate 50 as will be seen from sections (f), (g) and (i) of FIG. 6. If at least one of the signals at the non-inverted output terminals $Q_1$ and $Q_2$ of the flip-flop circuits 28 and 30 is of a logic "0" state, a logic "1" signal will be present at the output terminal of the NAND gate 50 as will be also seen from FIG. 6. These are all similar to those which occur for the above described second mode of operation.

Figure 6:
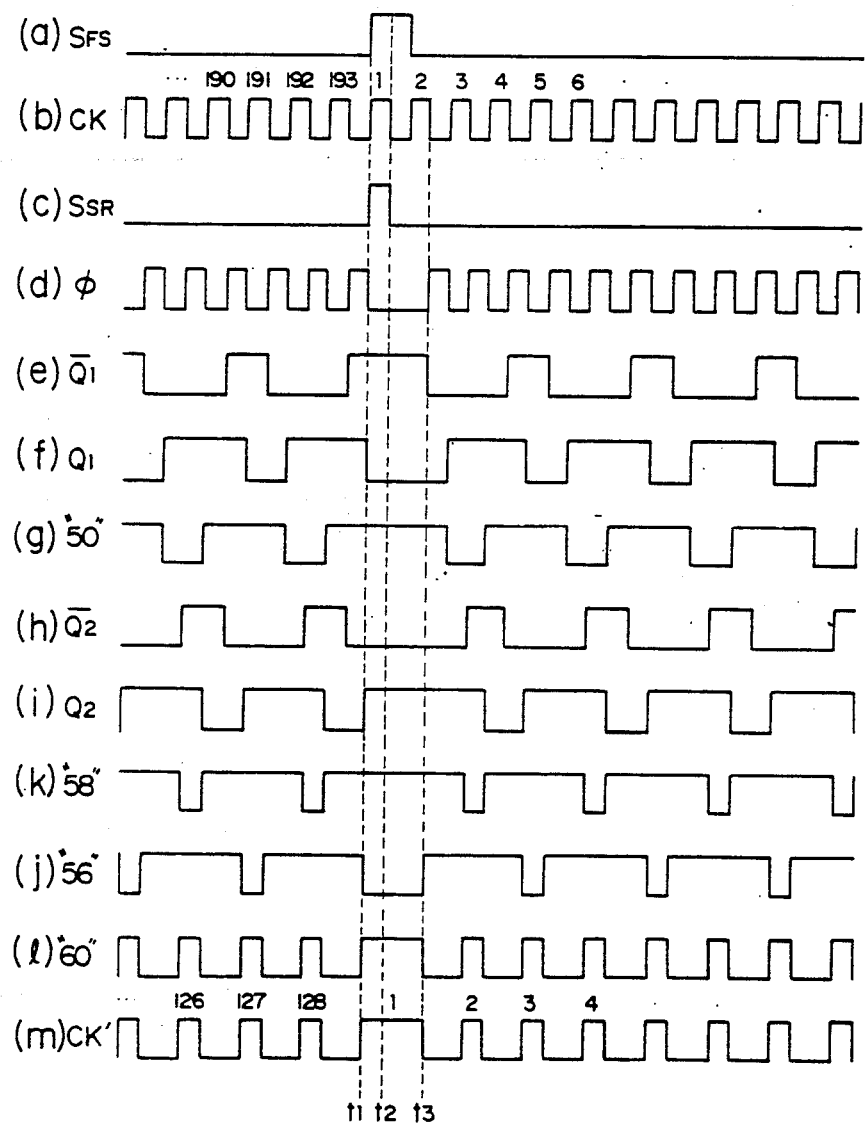
FIG. 6 is a timing chart also similar to FIG. 4 but shows examples of clock signals which are to appear during a third mode of operation of the divider circuit selecting the clock frequency of 1.5344 MHz for the input clock pulses.

It is now assumed that the logic "1" set/reset signal $S_{SR}$ appears at time $t_1$ concurrently with the synchronizing signal $S_{FS}$ as indicated in sections (a) and (c) of FIG. 6. The first flip-flop circuit 28 then receives a logic "0" signal at its set terminal S through the inverter 54 (FIG. 1) and concurrently the second flip-flop circuit 30 receives the logic "1" set/reset signal $S_{SR}$ at its reset terminal R. At this point of time, the control pulse $\phi$ supplied via the second control pulse line 26 to the first flip-flop circuit 28 is of a logic "0" state as will be seen from section (d) of FIG. 6. Accordingly, the gates 32 and 46 are closed and the gates 38 and 40 open in the first flip-flop circuit 28 and the gates 32' and 46' are closed and the gates 38' and 40' open in the second flip-flop circuit 30. In the presence of the logic "0" signal at its set terminal S, a logic "1" signal is present at the output terminal of the NAND gate 34 in the master flip-flop 28a of the first flip-flop circuit 28 and accordingly at the inverted output terminal $\overline{Q}_1$ of the flip-flop circuit 28 as will be seen from section (e) of FIG. 6. The logic "1" signal produced at the output terminal $\overline{Q}_1$ of the flip-flop circuit 28 is passed through the gate 40 and the inverter 42 so that a logic "0" signal appears at the non-inverted output terminal $Q_1$ of the flip-flop circuit 28 as will be seen from section (f) of FIG. 6.

With the logic "1" set/reset signal $S_{SR}$ being applied to the reset terminal R of the second flip-flop circuit 30, a logic "0" output signal is present at the inverted output terminal $\overline{Q}_2$ of the flip-flop circuit 30 as will be seen from section (h) of FIG. 6. The logic "0" signal produced at the output terminal $\overline{Q}_2$ is passed through the gate 40' and the inverter 42' so that a logic "1" signal appears at the non-inverted output terminal $Q_2$ of the flip-flop circuit 30 as will be seen from section (i) of FIG. 6. As will be understood from the description regarding the second mode of operation, the logic "1" signal thus produced at the non-inverted output terminal $Q_2$ of the second flip-flop circuit 30 is fed to the first and second NAND gates 56 and 58 of the frequency selector network 14 and causes the frequency selector network 14 to produce a logic "1" output signal at its clock output terminal CK' as shown in section (m) of FIG. 6.

When the supplied clock pulses thereafter rises to a logic "1" level at time $t_2$ which is later a half clock cycle than time $t_1$, the inverted control pulse $\bar{\phi}$ on the second control pulse supply line 26 remains at the logic "0" level as will be seen from section (d) of FIG. 6. Accordingly, the gates 32 and 46 remain closed and the gates 38 and 40 remain open in the first flip-flop circuit 28 and the gates 32' and 46' remain closed and the gates 38' and 40' remain open in the second flip-flop circuit 30. At time $t_2$, the set/reset signal $S_{SR}$ of the logic "1" state lapses as will be seen from section (c) of FIG. 6 so that a logic "1" signal is present at the set terminal S of the first flip-flop circuit 28 and a logic "0" signal present at the reset terminal R of the second flip-flop circuit 30. A logic "1" signal thus remains present at the inverted output terminal $\overline{Q}_2$ of the flip-flop circuit 30 as will be seen from section (e) of FIG. 6 with the logic "0" signal present at the reset terminal R and with the gate 38 open at time $t_2$. Accordingly, a logic "0" signal remains present at the non-inverted output terminal $Q_1$ of the flip-flop circuit 28 as will be seen from section (f) of FIG. 6.

With the logic "0" signal being applied to the reset terminal R of the second flip-flop circuit 30, furthermore, a logic "0" output signal remains present at the inverted output terminal $\overline{Q}_2$ of the flip-flop circuit 30 as will be seen from section (h) of FIG. 6 with the gate 38' open at time $t_2$. Accordingly, a logic "1" signal appears at the non-inverted output terminal $Q_2$ of the flip-flop circuit 30 as will be seen from section (i) of FIG. 6. The logic "1" signal produced at time $t_1$ at the clock output terminal CK' of the frequency selector network 14 (FIG. 1) is thus maintained at time $t_2$ as will be seen from section (m) of FIG. 6.

When the control pulse $\phi$ thereafter turns to a logic "0" level at time $t_3$ which is later one clock cycle than time $t_2$, the gates 32 and 46 are closed and the gates 38 and 40 open in the first flip-flop circuit 28 and the gates 32' and 46' are closed and the gates 38' and 40' open in the second flip-flop circuit 30. In the presence of a logic "1" signal at the input terminal $D_1$ and a logic "1" signal at the set terminal S of the first flip-flop circuit 28, the NAND gate 34 of the first flip-flop circuit 28 is now conditioned to produce a logic "0" output signal at the inverted output terminal $\overline{Q}_1$ of the flip-flop circuit 28 as will be seen from section (e) of FIG. 6 with the gate 38 made open at time $t_3$. The gate 40 being closed as above noted, the slave flip-flop 28b of the first flip-flop circuit 28 is isolated from the master flip-flop 28a so that the logic "0" signal at the inverted output terminal $\overline{Q}_1$ of the flip-flop circuit 28 is latched in the master flip-flop 28a. The slave flip-flop 28b of the first flip-flop circuit 28 thus maintains the status established therein during the immediately preceding clock cycle so that a logic "0" signal remains present at the non-inverted output terminal $Q_1$ of the flip-flop circuit 28 as will be seen from section (f) of FIG. 6.

The signal at the non-inverted output terminal $Q_1$ of the first flip-flop circuit 28, there is a logic "1" signal at the input terminal $D_1$ of the second flip-flop circuit 30. In the presence of the logic "0" signal at the reset terminal R and with the gate 38' made open at time $t_3$, a logic "0" output signal remains present at the inverted output terminal $\overline{Q}_2$ of the flip-flop circuit 30 as will be seen from section (h) of FIG. 6. The gate 40' being in the closed state, the logic "0" signal at the inverted output terminal $\overline{Q}_1$ of the second flip-flop circuit 30 is latched in the master flip-flop 30a. The slave flip-flop 30b of the second flip-flop circuit 30 thus maintains the state established therein during the immediately preceding clock cycle so that a logic "1" signal remains present at the non-inverted output terminal $Q_2$ of the flip-flop circuit 28 with the gate 46' closed at time $t_3$ as will be seen from section (i) of FIG. 6.

The logic "0" pulse produced at the inverted output terminal $\overline{Q}_1$ of the first flip-flop circuit 28 is supplied to one input terminal of the first NAND gate 56 of the frequency selector network 14. The pulse produced at the inverted output terminal $\overline{Q}_2$ of the second flip-flop circuit 30 is supplied to one input terminal of the second NAND gate 58. The pulse produced at the non-inverted output terminal $Q_2$ of the second flip-flop circuit 30 is fed to the other input terminal of each of the first and second NAND gates 56 and 58 and one input terminal of the fifth NAND gate 64. The frequency selector network 14 is thus conditioned as at time $t_2$ in the second mode of operation and is now operative to produce at the clock clock output terminal CK' a train of clock pulses which include 128 until the subsequent synchronizing signal $S_{FS}$ is fed to the clock control network 10 shown in FIG. 1, as will be seen from section (m) of FIG. 6. These clock pulses appearing at the clock output terminal CK' are equal in pulse cycle except for the pulse produced responsive to each synchronizing signal $S_{FS}$ and have a frequency of 1.024 MHz.

What is claimed is:

1. A clock frequency divider circuit for producing a signal of a desired frequency in response selectively to input clock pulses of a first predetermined frequency or input clock pulses of a second predetermined frequency, comprising (1) means for receiving first and second frequency selection signals each having first and second logic states, (2) means for receiving a synchronizing signal of a predetermined frequency larger than each of said first and second predetermined frequencies, (3) a clock control network which is responsive to said first frequency selection signal and to said synchronizing signal and which is to be supplied selectively with input clock pulses of said first predetermined frequency or input clock pulses of said second predetermined frequency, the clock control network being operative to produce a first control signal of a frequency which is equal to the frequency of said input clock pulses except in the presence of the first frequency selection signal of the second logic state and in the concurrent presence of said synchronizing signal, or a second control signal of a predetermined logic state in the copresence of the first frequency selection signal of the second logic state and said synchronizing signal, (4) a frequency division network which is responsive to said second frequency selection signal and selectively to said first or second control signal and which is operative to produce a first frequency-divided signal of a frequency equal to a first predetermined fraction of said first predetermined frequency in the presence of the second frequency selection signal of the first logic state, or a second frequency-divided signal of a frequency equal to a second predetermined fraction of said second predetermined frequency in the presence of the second frequency selection signal of the second logic state, and (5) a frequency selector network responsive to said second frequency selection signal and selectively to said first or second frequency-divided signal, said frequency selector network being operative to produce output clock pulses of a frequency equal to a first predetermined multiple of the frequency of said first frequency-divided signal in the presence of the second frequency selection signal of the first logic state, or output clock pulses of a frequency equal to a second predetermined multiple ("2") of the frequency of said second frequency-divided signal in the presence of the second frequency selection signal of the second logic state.

2. A clock frequency divider circuit as set forth in claim 1, in which said frequency selector network is constructed so that said first predetermined multiple is given as k which is an integer smaller than an integer m representative of the reciprocal of said first predetermined fraction and said second predetermined multiple is given as $(m/n)(f_1/f_2)$ where n is an integer representative of the reciprocal of said predetermined second fraction and $f_1$ and $f_2$ are representative of said first and second predetermined frequencies, respectively.

3. A clock frequency divider circuit as set forth in claim 1 or 2, in which said first control signal has first and second logic states and in which said frequency division network comprises first and second flip-flop circuits and a logic circuit intervening between the first and second flip-flop circuits, each of the first and second flip-flop circuits being responsive selectively to the first or second control signal from said clock control network and comprising a master flip-flop operative to have data latched therein in the presence of the first control signal of the first logic state or in the presence of said second control signal, and a slave flip-flop which is responsive to the data in the master flip-flop in the presence of the first control signal of the second logic state and which is to be isolated from the master flip-flop in the presence of the first control signal of the first logic state or in the presence of said second control signal, said logic circuit being operative to transfer data from the slave flip-flop of said first flip-flop circuit to the master flip-flop of said second flip-flop circuit and from the slave flip-flop of said second flip-flop circuit to the master flip-flop of said first flip-flop circuit.

4. A clock frequency divider circuit as set forth in claim 3, in which the master flip-flop of each of said first and second flip-flop circuits has an input terminal and an inverted output terminal and the slave flip-flop of each of said first and second flip-flop circuits has a non-inverted output terminal, the input terminal of the master flip-flop of the first flip-flop circuit being directly connected to the non-inverted output terminal of the second flip-flop circuit, the input terminal of the master flip-flop of the second flip-flop circuit being connected to the non-inverted output terminal of the first flip-flop circuit through said logic circuit.

5. A clock frequency divider circuit as set forth in claim 4, in which said logic circuit is operative to produce a signal of a first logic state in the presence of signals each of a first state at the non-inverted output terminals of said first and second flip-flop circuits and to produce a signal of a second logic state in the presence of a signals each of a second state at the non-inverted output terminal of at least one of said first and second flip-flop circuits.

* * * * *